US012805310B2

(12) United States Patent
Lee et al.

(10) Patent No.: US 12,805,310 B2
(45) Date of Patent: Nov. 17, 2026

(54) ACCURATE AND FAST POWER MODULE PROPERTIES ASSESSMENT

(71) Applicant: GE Aviation Systems LLC, Grand Rapids, MI (US)

(72) Inventors: Shung Ik Lee, Boca Raton, FL (US); Liqiang Yang, Coral Springs, FL (US); Darrell L. Grimes, Boca Raton, FL (US); Hyunmin Cho, Weston, FL (US); Richard Eddins, Margate, FL (US); Joseph L. Smolenski, Slingerlands, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 108 days.

(21) Appl. No.: 19/023,798

(22) Filed: Jan. 16, 2025

(65) Prior Publication Data

US 2025/0157871 A1 May 15, 2025

Related U.S. Application Data

(63) Continuation of application No. 17/957,333, filed on Sep. 30, 2022, now abandoned.

(51) Int. Cl.
*H10W 40/00* (2026.01)
*G01K 1/143* (2021.01)
(Continued)

(52) U.S. Cl.
CPC ............ *H10W 40/00* (2026.01); *G01K 1/143* (2013.01); *G01K 7/02* (2013.01); *G01K 7/16* (2013.01);
(Continued)

(58) Field of Classification Search
CPC .......... G01K 1/143; G01K 3/005; G01K 7/02; G01K 7/16; G01K 7/425; G01R 19/0092;
(Continued)

(56) References Cited

U.S. PATENT DOCUMENTS 6,836,205 B2 12/2004 Scott
7,638,874 B2 12/2009 Chiu
(Continued)

FOREIGN PATENT DOCUMENTS

CN 112327127 2/2021
FR 3127024 3/2023
(Continued)

OTHER PUBLICATIONS

USPTO; U.S. Appl. No. 17/957,333; Notice of Allowance and Fees Due (PTOL-85) mailed Oct. 17, 2024; (pp. 1-8).
(Continued)

*Primary Examiner* — Kevin J Comber
(74) *Attorney, Agent, or Firm* — Fitch, Even, Tabin & Flannery LLP

(57) ABSTRACT

Systems and methods for accurate and fast measurement of junction temperature for power modules are provided. Such systems and methods include a one or more power transistors that each have a respective die surface over which is positioned and electrically coupled to a conductive overlay. A temperature sensor is physically bonded to a top surface of the conductive overlay to provide a direct temperature measurement for the one or more power transistors.

18 Claims, 7 Drawing Sheets

(51) Int. Cl.

| | |
|---|---|
| ***G01K 7/02*** | (2021.01) |
| ***G01K 7/16*** | (2006.01) |
| ***G01R 19/165*** | (2006.01) |
| ***H02H 1/00*** | (2006.01) |
| ***H02H 7/12*** | (2006.01) |
| ***H10W 70/60*** | (2026.01) |
| ***H10W 70/63*** | (2026.01) |
| ***H10W 90/00*** | (2026.01) |

(52) U.S. Cl.
CPC ....... *G01R 19/1659* (2013.01); *H02H 1/0007* (2013.01); *H02H 1/0038* (2013.01); *H02H 7/1203* (2013.01); *H10W 70/611* (2026.01); *H10W 70/635* (2026.01); *H10W 90/00* (2026.01); *H10W 90/734* (2026.01)

(58) Field of Classification Search
CPC ............ G01R 19/1659; G01R 31/2601; G01R 31/2628; G01R 31/2642; H02H 1/0007; H02H 1/0038; H02H 7/1203; H10W 40/00; H10W 70/611; H10W 70/635; H10W 72/07337; H10W 76/15; H10W 90/00; H10W 90/734
USPC .............................................................. 361/1
See application file for complete search history.

(56) References Cited

U.S. PATENT DOCUMENTS

| | | | | |
|---|---|---|---|---|
| 9,474,189 | B2 | 10/2016 | Kawauchi | |
| 10,260,960 | B2 | 4/2019 | Shen | |
| 10,939,537 | B1 | 3/2021 | Lebron | |
| 2004/0222430 | A1* | 11/2004 | Necco | G01K 7/01 257/E29.338 |
| 2013/0077222 | A1* | 3/2013 | Sleven | G01K 11/265 361/679.4 |
| 2014/0138807 | A1* | 5/2014 | Gowda | H10W 40/255 257/666 |
| 2014/0226695 | A1 | 8/2014 | Farnsworth | |
| 2015/0182966 | A1 | 7/2015 | Coursey | |
| 2016/0014916 | A1 | 1/2016 | Ausserlechner | |
| 2021/0125903 | A1* | 4/2021 | Tani | H10W 40/778 |
| 2021/0255046 | A1 | 8/2021 | Gallestey | |
| 2021/0296217 | A1* | 9/2021 | Tang | G01K 1/16 |
| 2022/0065706 | A1 | 3/2022 | Nunez | |
| 2022/0070996 | A1 | 3/2022 | Esler | |
| 2023/0068223 | A1* | 3/2023 | Nuotio | H02M 1/08 |
| 2024/0112976 | A1 | 4/2024 | Lee | |

FOREIGN PATENT DOCUMENTS

| | | |
|---|---|---|
| FR | 3127025 | 3/2023 |
| FR | 3127269 | 3/2023 |
| FR | 3129375 | 5/2023 |
| FR | 3129428 | 5/2023 |
| FR | 3129432 | 5/2023 |
| FR | 3129436 | 5/2023 |
| FR | 3129690 | 6/2023 |
| FR | 3129970 | 6/2023 |
| FR | 3129972 | 6/2023 |
| FR | 3130313 | 6/2023 |
| FR | 3130323 | 6/2023 |
| FR | 3130747 | 6/2023 |
| FR | 3130874 | 6/2023 |
| FR | 3130875 | 6/2023 |
| FR | 3130877 | 6/2023 |
| FR | 3130879 | 6/2023 |
| FR | 3130894 | 6/2023 |
| FR | 3130895 | 6/2023 |
| FR | 3130896 | 6/2023 |
| FR | 3130897 | 6/2023 |
| FR | 3132279 | 8/2023 |
| FR | 3132729 | 8/2023 |
| FR | 3132743 | 8/2023 |
| FR | 3133367 | 9/2023 |
| FR | 3133368 | 9/2023 |
| JP | 2008042091 | 2/2008 |
| JP | 2012142351 | 7/2012 |
| JP | 2021064707 | 4/2021 |
| JP | 2021072293 | 5/2021 |
| WO | 2006068082 | 6/2006 |
| WO | 2018220721 | 12/2018 |

OTHER PUBLICATIONS

Wolfspeed All-SiC Module CAB450M12XM3; Website: https://www.i-micronews.com/products/wolfspeed-all-sic-module-cab450m12xm3/?cn-reloaded=1; i-Micronews; Oct. 2019; 3 pgs.

* cited by examiner

ACCURATE AND FAST POWER MODULE PROPERTIES ASSESSMENT

CROSS-REFERENCE TO RELATED APPLICATION(S)

This application is a continuation of U.S. patent application Ser. No. 17/957,333, filed Sep. 30, 2022, which is hereby incorporated by reference in its entirety.

TECHNICAL FIELD

These teachings relate generally to power modules and more particularly to junction temperature measurement of power modules.

BACKGROUND

Power modules employ transistors to output stable and reliable power for a variety of applications including use in aircraft and similar high-performance systems. Further, the operation of power modules can produce a sizable amount of heat that, if not properly managed, can damage the power module and/or produce unreliable operating conditions and power output. As such, control circuitry is often employed to consider temperature when operating the power module.

BRIEF DESCRIPTION OF DRAWINGS

Various needs are at least partially met through provision of the accurate and fast assessment or measurement of various properties of power modules described in the following detailed description, particularly when studied in conjunction with the drawings. A full and enabling disclosure of the aspects of the present description, including the best mode thereof, directed to one of ordinary skill in the art, is set forth in the specification, which refers to the appended figures, in which.

Figure 1:
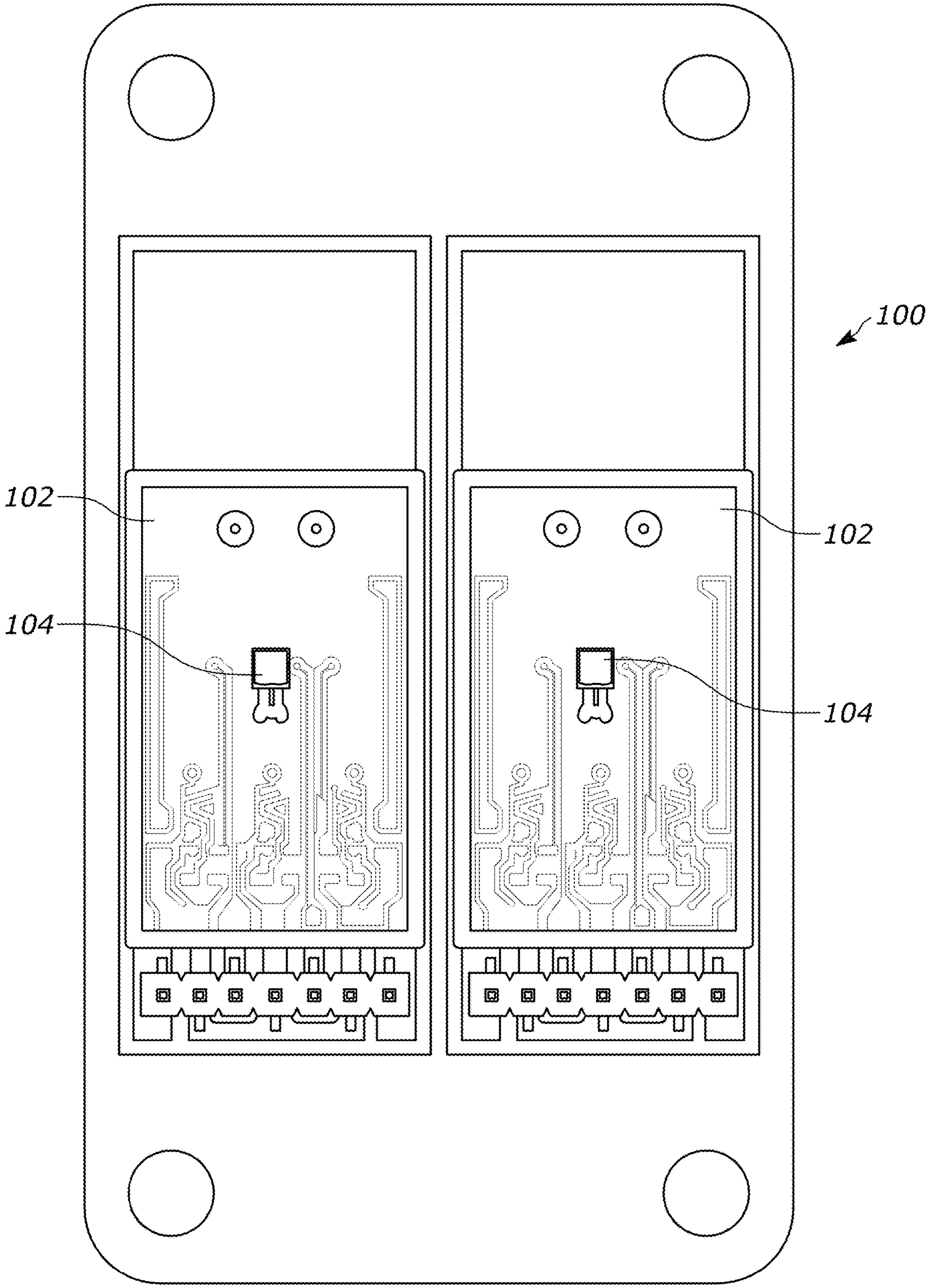
FIG. 1 comprises a schematic view of a power module as configured in accordance with various embodiments of these teachings.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

Typical power modules are constructed from a plurality of transistors with a plurality of surface wire bonds on a die surface for interconnecting the transistors and control circuitry together. As such, these modules do not provide an area for direct temperature sensing on the die surface. Rather, the modules employ alternative temperature sensing from printed circuit board (PCB) control circuitry, including indirect methods such as measuring a body diode, expensive optical method, or the like. The lack of a simple direct temperature measurement method increases operational costs and limits reliability and safety.

Generally speaking, the various aspects of the present disclosure can be employed with a power module comprising one or more power transistors and a conductive overlay for each of the one or more power transistors to provide a direct mounting surface for sensors such as a temperature sensor that can provide a direct temperature measurement for the one or more power transistors. The conductive overlay can include a well-defined metallic and stable surface that is directly connected to the power transistor die surface with short-distance metal connections. The additional surface of the conductive overlay makes it is possible to position a temperature sensor on top to provide fast and accurate sensing capability to improve reliability of module operation. This sensor can be easily wired to a PCB controller and data from the sensor can be provided to a gate board to provide for reliable module operation. The direct temperature measurement can result in increased reliability and safety when operating power modules.

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

The foregoing and other benefits may become clearer upon making a thorough review and study of the following detailed description. Referring now to the drawings, and in particular to FIG. 1, a power module 100 is presented. The power module 100 can include conductive overlays 102 having temperature sensors 104 adhered or bonded to a top surface thereof. In some embodiments, the conductive overlays 102 can include a copper or other conductive material power overlay (POL) sufficient to provide a coupling surface for the temperature sensors 104. Such a POL configuration can provide a planar interconnection region where various system inputs and outputs and external devices can interface with one or more power transistors 108 (see FIG. 2). Examples of a POL that may form the conductive overlays 102 described herein are provided in U.S. Pat. No. 10,269,688, the entirety of which is incorporated by reference. However, it will be appreciated that the embodiments described herein are also applicable with respect to alternative planar interconnect technologies such as copper clips, multilayer organic PCB, etc. and also flip chip and chip-in-polymer technologies.

Figure 2:
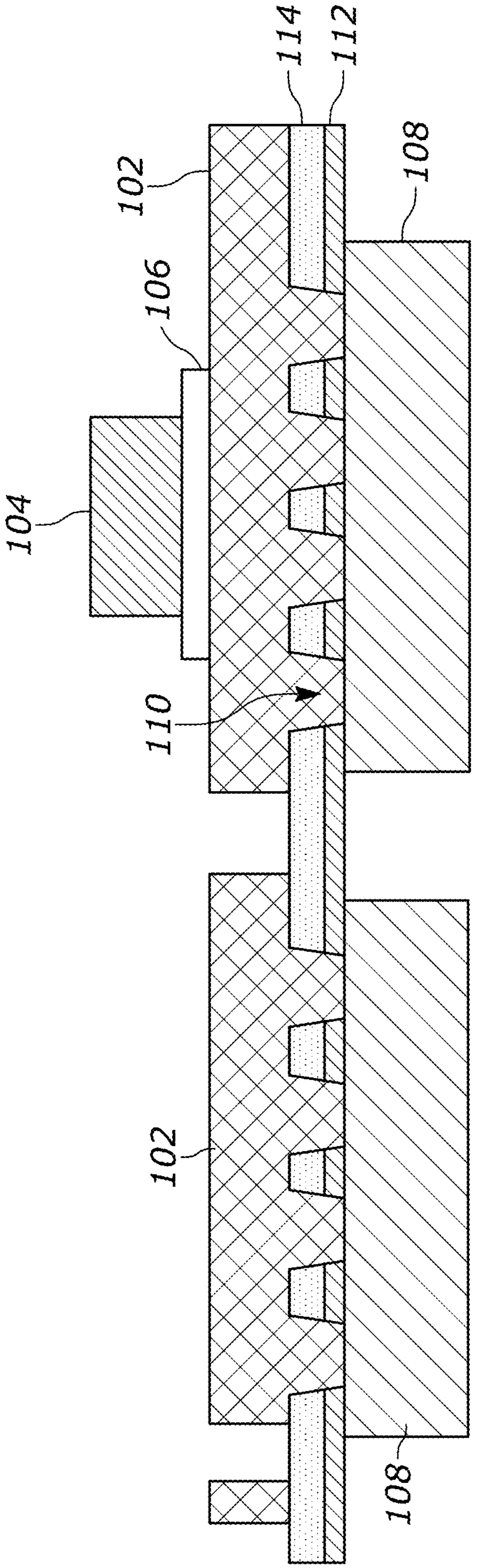
FIG. 2 comprises a partial cross-sectional view of a power module as configured in accordance with various embodiments of these teachings.

Turning now to FIG. 2, a partial cross-section view of the power module 100 is shown. The power module 100 can further include heat conductive epoxy 106 for bonding the temperature sensors 104 to the conductive overlays 102. The heat conductive epoxy 106 can serve as a heat transfer medium between the top surface of the conductive overlays 102 and the temperature sensors 104 so that the temperature sensors 104 get consistent and accurate readings therefrom. The temperature sensors 104 can be attached with the heat conductive epoxy 106 on the wide, well defined, metallic, and stable surface of the conductive overlays 102. Further, the position of the temperature sensors 104 can correspond to the highest temperature locations on the conductive overlays 102. In some embodiments, the highest temperature locations can be identified by modeling operation of the power module 100. In some embodiments, the temperature sensors 104 can be attached to the conductive overlays 102 over a central one of the one or more power transistors 108, which modeling and testing indicates as the hottest location for the power module 100. However, it will be appreciated that other locations are also contemplated and in some embodiments multiple temperature sensors may be positioned in close proximity to the same general location.

The temperature sensors 104 can include thermocouples and/or a resistance temperature detector having a non-conductive housing.

The one or more power transistors 108 have respective die surfaces over which the conductive overlays 102 are positioned. The power transistors 108 can include Silicon-carbide (SiC) MOSFETs or similar power transistors known in the art.

A non-conductive layer 114 and an adhesive layer 112 can be positioned between the conductive overlays 102 and the one or more power transistors 108. The non-conductive layer 114 can act as a dielectric layer between the respective die surfaces of the power transistors 108 and the conductive overlays 102. The non-conductive layer 114 can include Kapton or other similar material.

Further, the conductive overlays 102 can include vias 110 that electrically couple the conductive overlays 102 to the one or more power transistors 108. In these embodiments, the vias 110 can pass through the non-conductive layer 114 and the adhesive layer 112 to provide a direct metallic connection between the conductive overlays 102 and the one or more power transistors 108. Additionally or alternatively, in some embodiments, one or more sintered layers can be utilized to interconnect the conductive overlays 102 to the surfaces of the one or more power transistors.

Figure 3:
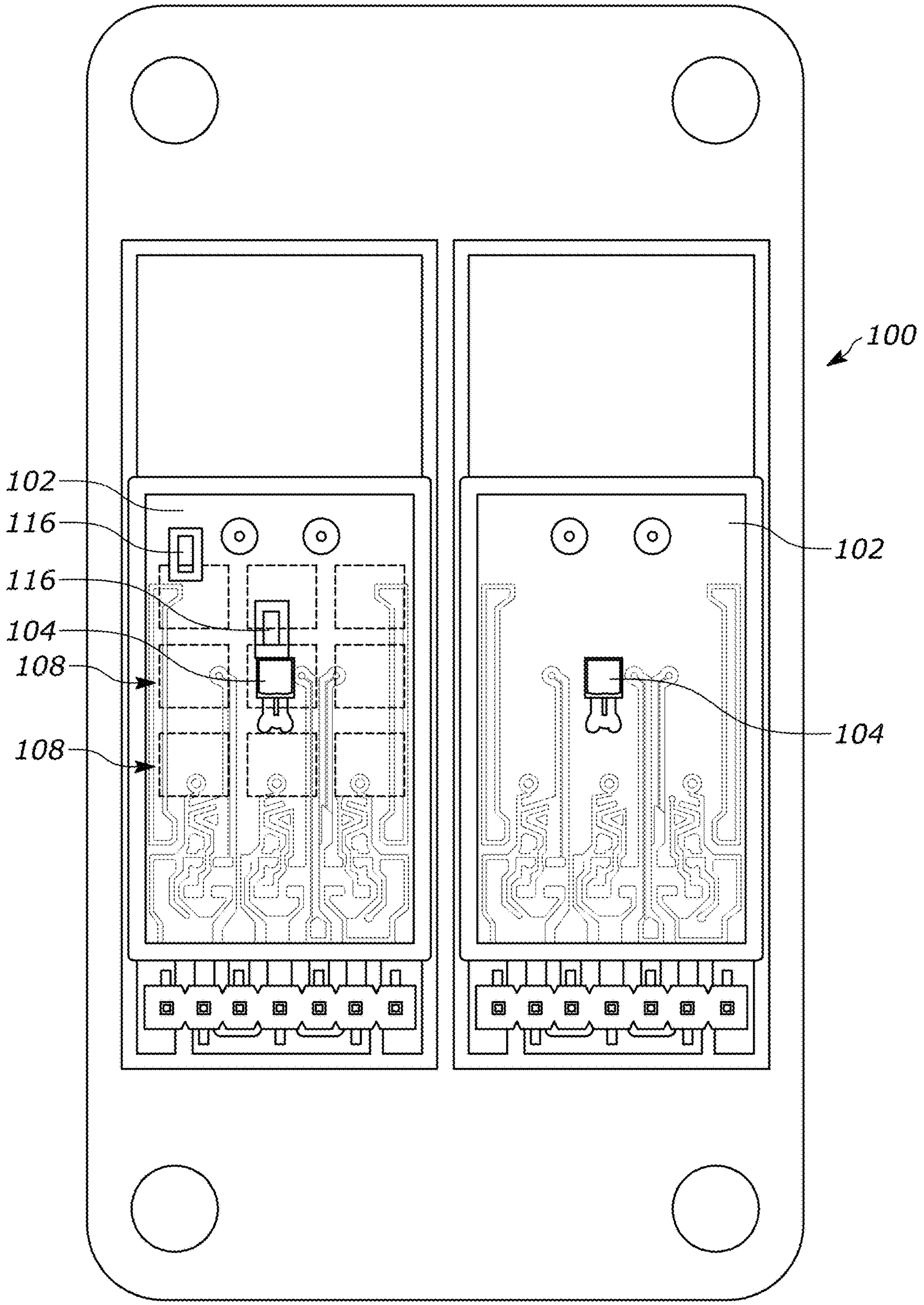
FIG. 3 comprises a schematic view of a power module as configured in accordance with various embodiments of these teachings.

Turning now to FIG. 3, another schematic view of the power module 100 is shown. As seen in FIG. 3, in some embodiments, the power module 100 can include additional sensors coupled to the conductive overlays 102. The additional sensors can include a plurality of current sensors 116 that are physically bonded and electrically coupled to the conductive overlays 102 to measure current flow between two of the one or more power transistors 108 or other elements of the power module 100.

Figure 4:
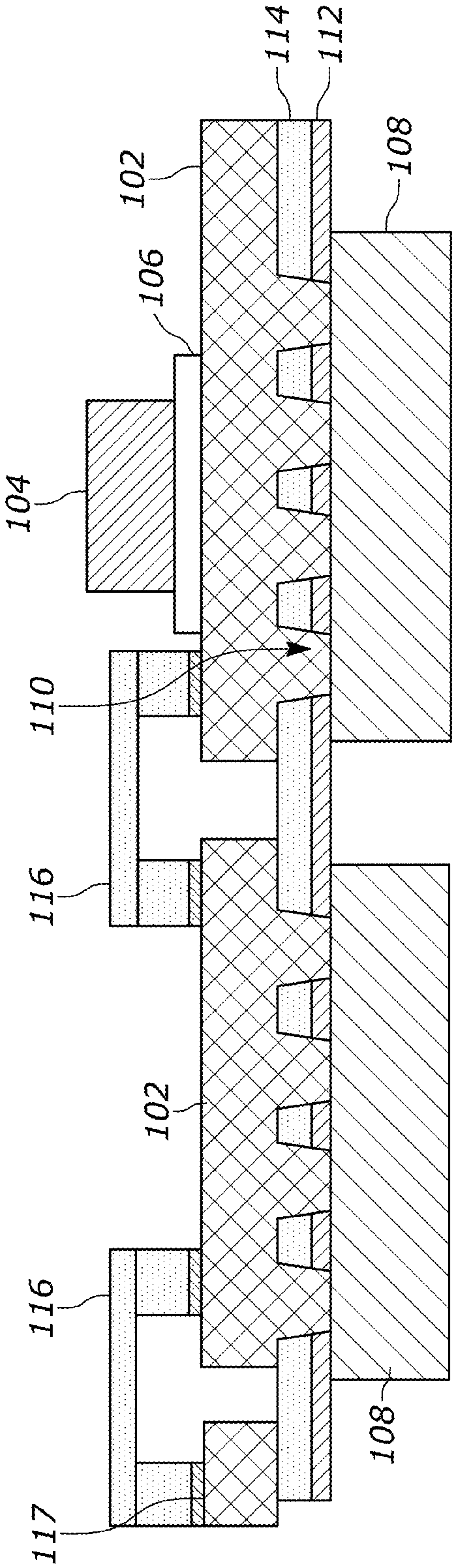
FIG. 4 comprises a partial cross-sectional view of a power module as configured in accordance with various embodiments of these teachings.

As seen in the additional partial cross-section view of the power module 100 of FIG. 4, the current sensors 116 can be bonded to the conductive overlays 102 with solder 117 and can bridge over gaps between sections of the conductive overlays 102. The current sensors 116 can include current sensing shunts that are attached to the conductive overlays 102 during an assembly process for the power module 100. The current sensors 116 can be positioned between other current or temperature sensors or between top copper sections of the conductive overlays 102 to provide for a local current value.

In some embodiments, the conductive overlays 102 are displaced a distance from the respective die surface of each of the plurality of transistors 108 such that the temperature sensors 104 and/or the plurality of current sensors 116 coupled to the top surface of the conductive overlays 102 are also displaced from the respective die surface of each of the plurality of transistors 108 by the distance. The vias 110 can bridge the distance to electrically couple the conductive overlay 102 to each of the one or more power transistors 108.

The distance between the top surface of the conductive overlays 102 to which the temperature sensors 104 and solder current sensors 116 are coupled and the top surface of the power transistors 108 can be approximately 150 μm, where 100 μm of the distance results from a thickness of the conductive overlays 102 and 50 μm of the distance results from a thickness of the vias 110. The short distance between the top surface of the power transistors 108 and the top surface of the conductive overlays 102 to which the temperature sensors 104 are coupled can increases the accuracy of temperature measurement as compared to other indirect temperature measurement methods. In particular the close distance helps to ensure that the temperature reading closely corresponds to the actual temperature of the top surface of the power transistors 108 because the distance limits dissipation of heat before it is read by the temperature sensors 104 and/or limits the influence of other heat sources on the temperature value read by the temperature sensors 104.

Figure 5:
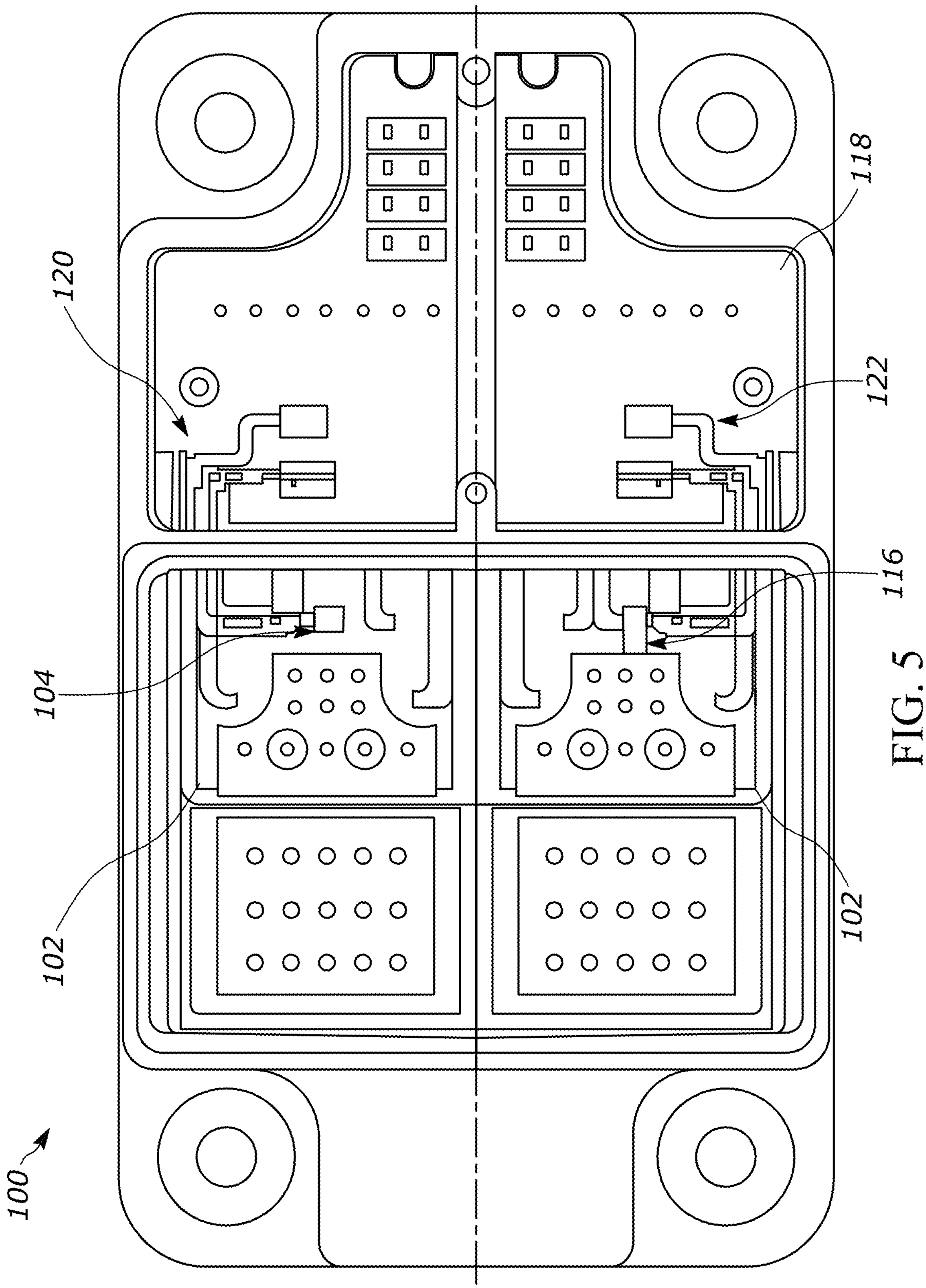
FIG. 5 comprises a schematic view of a power module as configured in accordance with various embodiments of these teachings.

Turning now to FIG. 5 another schematic of the power module 100 is shown. As seen in FIG. 5, the temperature sensors 104 and the plurality of current sensors 116 can be electrically coupled to control circuit 118 via wires and solder 120 and 122 respectively.

Figure 6:
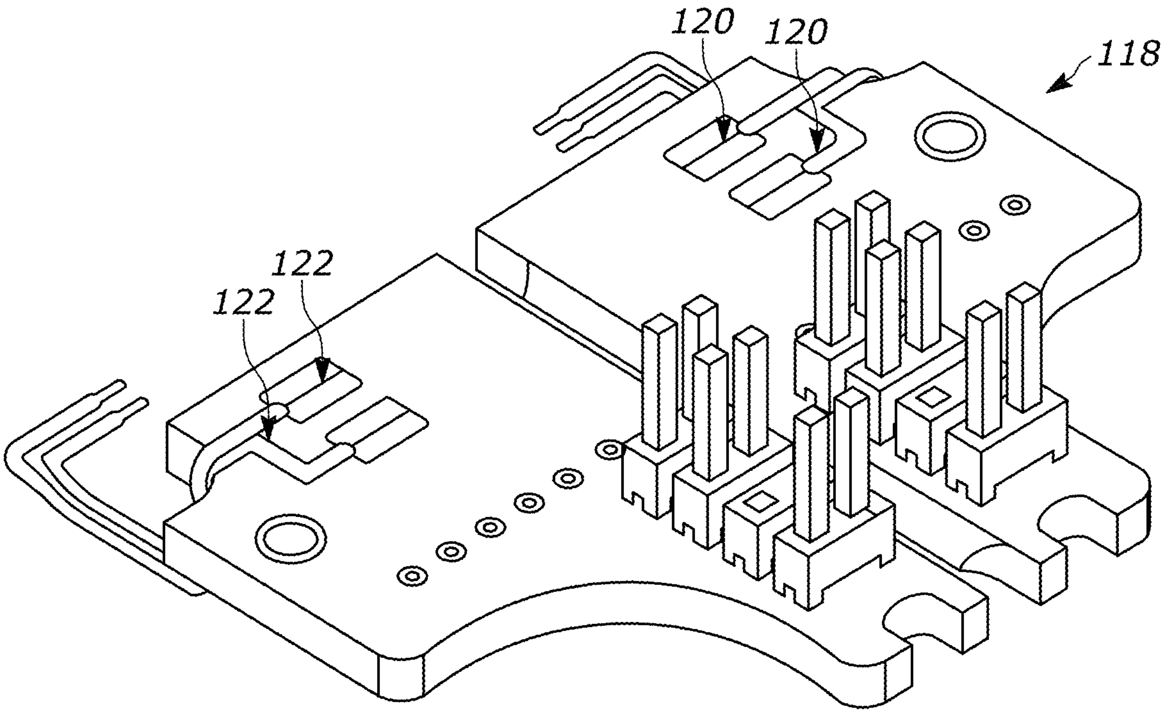
FIG. 6 comprises a perspective view of a control circuit for a power module as configured in accordance with various embodiments of these teachings.

As seen in FIG. 6, the control circuit 118 can include a printed circuit board that can rest within a housing that contains the rest of the power module 100. The control circuit 118 can pass signals to a gate board that is connected to the control circuit 118 to assist in controlling operation of the one or more power transistors 108.

It will be appreciated that although the embodiments of the power module 100 shown in FIGS. 1-6 depict two conductive overlays 102 coupled to two groups or sets of the one or more power transistors 108, embodiments with more and fewer conductive overlays 102 are contemplated.

Figure 7:
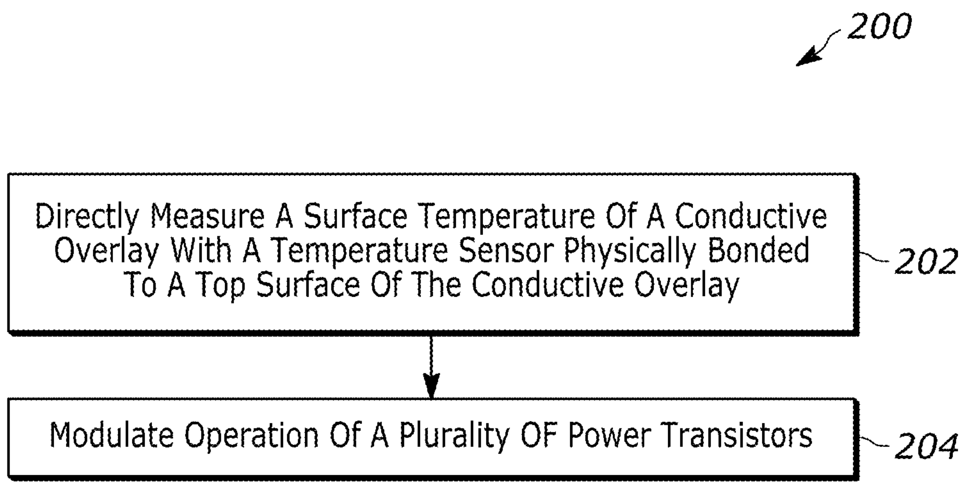
FIG. 7 comprises a flow diagram of a method in accordance with various embodiments of these teachings.

Turning now to FIG. 7, the embodiments described herein are also directed to a method 200 of controlling the power module 100 using the control circuit 118. According to a step

202 of the method 200, the temperature sensors 104 directly measure a surface temperature of the conductive overlays 102 and/or the current sensors 116 measure current flow. According to a step 204 of the method 200, the control circuit 118 modulates operation of the one or more power transistors 108, which are electrically coupled to the control circuit 118.

Modulating the operation of the power transistors 108 can be based on one or more of the direct measurement of the surface temperature with the temperature sensors 104 and the measurement of current flow from the plurality of current sensors 116. Further, modulating the operation of the power transistors 108 can include stopping operation of one, more, or all of the one or more power transistors 108 when the direct temperature measurement and or the current measurements exceed preconfigured threshold values. Further, modulating the operation of the power transistors 108 can include limiting operation of one, more, or all of the one or more power transistors 108 when the direct temperature measurement and or the current measurements exceed additionally preconfigured threshold values. Limiting the operation can include shutting down only some of the one or more power transistors 108 and/or changing operating parameters such as switching frequency, power input or the like such that the temperature and or current measurement values will be reduced to levels consistent with normal safe operation of the power module 100.

In some embodiments, the current sensors 116 can measure the current from different locations on the conductive overlays 102 in parallel. In these embodiments, incremental differences in the current from each location can be monitored and when the current value at one location deviates more than a preconfigured amount from the other current values, the control circuit 118 can modulate the operation of the power transistors 108 to avoid catastrophic failure. For example, such modulation can include shutting down operation of some or all power transistors 108. Further, in some embodiments, the control circuit can shutdown only ones of the power transistors 108 that are linked to the current sensors whose current value exceeded the preconfigured threshold.

Further aspects of the disclosure are provided by the subject matter of the following clauses:

A power module comprising one or more power transistors each having a respective die surface; a conductive overlay electrically coupled to each of the one or more power transistors over the respective die surface thereof; and a temperature sensor coupled to a top surface of the conductive overlay to provide a direct temperature measurement for the one or more power transistors.

The power module of any preceding clause further comprising a current sensor physically bonded and electrically coupled to the conductive overlay to measure current flow between two of the one or more power transistors.

The power module of any preceding clause wherein the current sensor comprises a current sensing shunt.

The power module of any preceding clause further comprising a control circuit electrically coupled to the one or more power transistors, the temperature sensor, and the current sensor, wherein the control circuit is configured to modulate operation of the one or more power transistors based on the direct temperature measurement from the temperature sensor and the measurement of current flow.

The power module of any preceding clause wherein modulating the operation of the one or more power transistors includes stopping operation of the one or more power transistors when at least one of the direct temperature measurement and the measurement of current flow exceeds a threshold value.

The power module of any preceding clause wherein modulating the operation of the one or more power transistors includes limiting operation of the one or more power transistors when at least one of the direct temperature measurement and the measurement of current flow exceeds a threshold value.

The power module of any preceding clause wherein the one or more power transistors include Silicon-carbide (SIC) MOSFETs.

The power module of any preceding clause wherein conductive overlay is displaced a distance from the respective die surface of each of the plurality of transistors, and wherein the conductive overlay includes conductive vias that bridge the distance to electrically couple the conductive overlay to each of the one or more power transistors.

The power module of any preceding clause wherein the temperature sensor comprises a resistance temperature detector having a non-conductive housing.

The power module of any preceding clause wherein the temperature sensor is bonded to the conductive overlay with heat conductive epoxy.

The power module of any preceding clause further comprising a control circuit electrically coupled to the one or more power transistors and the temperature sensor, wherein the control circuit is configured to modulate operation of the one or more power transistors based on the direct temperature measurement from the temperature sensor.

The power module of any preceding clause wherein modulating the operation of the one or more power transistors includes stopping operation of the one or more power transistors when the direct temperature measurement exceeds a threshold value.

The power module of any preceding clause wherein modulating the operation of the one or more power transistors includes limiting operation of the one or more power transistors when the direct temperature measurement exceeds a threshold value.

A power module comprising a one or more power transistors each having a respective die surface; a first conductive overlay electrically coupled to a first group of the one or more power transistors over the respective die surface thereof; a second conductive overlay electrically coupled to a second group of the one or more power transistors over the respective die surface thereof; a first temperature sensor physically bonded to a top surface of the first conductive overlay to provide a direct temperature measurement for the first group of the one or more power transistors; a second temperature sensor physically bonded to a top surface of the second conductive overlay to provide a direct temperature measurement for the second group of the one or more power transistors; a plurality of current sensor physically bonded and electrically coupled to the first conductive overlay or the second conductive overlay, each of the plurality of current sensors configured to measure current flow between two of the one or more power transistors; and a control circuit electrically coupled to the one or more power transistors, the first and second temperature sensors, and the plurality of current sensors, wherein the control circuit is configured to modulate operation of the one or more power transistors based on the direct temperature measurements from the first and second temperature sensors and the measurements of current flow from the plurality of current sensors.

The power module of any preceding clause wherein modulating the operation of the one or more power transistors includes stopping operation of the one or more power transistors when either of the direct temperature measurements exceeds a threshold value.

The power module of any preceding clause wherein modulating the operation of the one or more power transistors includes limiting operation of the one or more power transistors when either of the direct temperature measurements exceeds a threshold value.

The power module of any preceding clause wherein the one or more power transistors include Silicon-carbide (SIC) MOSFETs.

The power module of any preceding clause wherein the first and the second conductive overlays are displaced a distance from the respective die surfaces of each of the one or more power transistors, and wherein the first and the second conductive overlays include conductive vias that bridge the distance to electrically couple the first and the second conductive overlays to each of the one or more power transistors.

The power module of any preceding clause wherein the first and the second temperature sensors comprise resistance temperature detectors having non-conductive housings.

A method comprising directly measuring a surface temperature of a conductive overlay with a temperature sensor physically bonded to a top surface of the conductive overlay, the conductive overlay being electrically coupled to a one or more power transistors over a respective die surface thereof; and modulating operation of the one or more power transistors with a control circuit electrically coupled to the one or more power transistors, wherein the modulating is based on the direct measurement of the surface temperature.

The power module of any preceding clause wherein the conductive overlay is displaced a distance from the respective die surface of each of the plurality of transistors, and wherein at least one sintered layer bridges the distance to electrically couple the conductive overlay to each of the one or more power transistors.

A method of manufacturing a power module comprising forming conductive overlay on a first surface of one or more power transistors; and coupling a temperature sensor to a top surface of the conductive overlay.

The method of any preceding clause further comprising physically and electrically coupling a current sensor to the conductive overlay at a location between two different ones of the one or more power transistors.

The method of any preceding clause further comprising coupling a non-conductive layer to the first surface of the one or more power transistors via an adhesive layer; and forming the conductive overlay over the non-conductive layer with vias that extend through the non-conductive layer and the adhesive layer to the first surface of the one or more power transistors.

The method of any preceding clause further comprising electrically coupling the temperature sensor to a control circuit.

The power module of any preceding clause wherein the conductive overlay is displaced a distance from the respective die surface of each of the one or more power transistors, and wherein at least one sintered layer bridges the distance to electrically couple the conductive overlay to each of the one or more power transistors.

The invention claimed is:

1. A power module comprising:

a one or more power transistors each having a respective die surface;

a conductive overlay electrically coupled to each of the one or more power transistors over the respective die surface thereof; and a temperature sensor bonded to a top surface of the conductive overlay to provide a direct temperature measurement for the one or more power transistors;

wherein the conductive overlay is displaced a distance from the respective die surface of each of the one or more power transistors, and wherein the conductive overlay includes conductive vias that bridge the distance to electrically couple the conductive overlay to each of the one or more power transistors.

2. The power module of claim 1 further comprising:

a current sensor physically and electrically coupled to the conductive overlay to measure current flow between two of the one or more power transistors.

3. The power module of claim 2 wherein the current sensor comprises a current sensing shunt.

4. The power module of claim 2 further comprising:

a control circuit electrically coupled to the one or more power transistors, the temperature sensor, and the current sensor, wherein the control circuit is configured to modulate operation of the one or more power transistors based on the direct temperature measurement from the temperature sensor and the measurement of current flow.

5. The power module of claim 4 wherein modulating the operation of the one or more power transistors includes stopping operation of the one or more power transistors when at least one of the direct temperature measurement and the measurement of current flow exceeds a threshold value.

6. The power module of claim 4 wherein modulating the operation of the one or more power transistors includes limiting operation of the one or more power transistors when at least one of the direct temperature measurement and the measurement of current flow exceeds a threshold value.

7. The power module of claim 1 wherein the one or more power transistors include Silicon-carbide (SiC) MOSFETs.

8. The power module of claim 1 wherein the temperature sensor comprises a resistance temperature detector having a non-conductive housing.

9. The power module of claim 1 wherein the temperature sensor is bonded to the conductive overlay with a heat conductive epoxy.

10. The power module of claim 1 further comprising:

a control circuit electrically coupled to the one or more power transistors and the temperature sensor, wherein the control circuit is configured to modulate operation of the one or more power transistors based on the direct temperature measurement from the temperature sensor.

11. The power module of claim 10 wherein modulating the operation of the one or more power transistors includes stopping operation of the one or more power transistors when the direct temperature measurement exceeds a threshold value.

12. The power module of claim 10 wherein modulating the operation of the one or more power transistors includes limiting operation of the one or more power transistors when the direct temperature measurement exceeds a threshold value.

13. The power module of claim 1 wherein the conductive overlay is displaced a distance from the respective die surface of each of the one or more power transistors, and wherein at least one sintered layer bridges the distance to electrically couple the conductive overlay to each of the one or more power transistors.

14. A method comprising:

directly measuring a surface temperature of a conductive overlay with a temperature sensor bonded to a top surface of the conductive overlay, the conductive overlay being electrically coupled to one or more power transistors over a respective die surface thereof; and modulating operation of the one or more power transistors with a control circuit electrically coupled to the one or more power transistors, wherein the modulating is based on the direct measurement of the surface temperature;

wherein the conductive overlay is displaced a distance from the respective die surface of each of the one or more power transistors, and wherein the conductive overlay includes conductive vias that bridge the distance to electrically couple the conductive overlay to each of the one or more power transistors.

15. A method of manufacturing a power module comprising:

forming conductive overlay on a first surface of one or more power transistors; and bonding a temperature sensor to a top surface of the conductive overlay;

wherein the conductive overlay is displaced a distance from a respective die surface of each of the one or more power transistors, and wherein the conductive overlay includes conductive vias that bridge the distance to electrically couple the conductive overlay to each of the one or more power transistors.

16. The method of claim 15 further comprising physically and electrically coupling a current sensor to the conductive overlay at a location between two different ones of the one or more power transistors.

17. The method of claim 15 further comprising:

coupling a non-conductive layer to the first surface of the one or more power transistors via an adhesive layer; and forming the conductive overlay over the non-conductive layer with vias that extend through the non-conductive layer and the adhesive layer to the first surface of the one or more power transistors.

18. The method of claim 15 further comprising electrically coupling the temperature sensor to a control circuit.

* * * * *